(12) United States Patent
Saito

(10) Patent No.: US 8,743,248 B2
(45) Date of Patent: Jun. 3, 2014

(54) SOLID-STATE IMAGING DEVICE, METHOD OF DRIVING SOLID-STATE IMAGING DEVICE, AND IMAGE PROCESSING DEVICE

(75) Inventor: Masashi Saito, Tokyo (JP)

(73) Assignee: Olympus Corporation, Tokyo (JP)

( * ) Notice: Subject to any disclaimer, the term of this patent is extended or adjusted under 35 U.S.C. 154(b) by 792 days.

(21) Appl. No.: 13/019,560

(22) Filed: Feb. 2, 2011

(65) Prior Publication Data

US 2011/0194003 A1    Aug. 11, 2011

(30) Foreign Application Priority Data

Feb. 5, 2010  (JP) ................................ 2010-024408

(51) Int. Cl.
*H04N 5/335*    (2011.01)
(52) U.S. Cl.
CPC .................................... *H04N 5/335* (2013.01)
USPC ........................................................ 348/294
(58) Field of Classification Search
CPC ................... H01L 27/14643; H01L 27/14609; H01L 27/14831; H04N 3/155; H04N 9/045; H04N 5/232; H04N 5/772; H04N 5/361; H04N 5/3575; H04N 5/378; H04N 1/2112; H04N 5/907; H04N 5/335; H04N 3/1575; H04N 3/1562; H03M 1/12; H03M 1/1215; H03M 3/30; H03M 1/56; H03M 1/00; H03M 2201/4225; H03M 2201/4135; H03M 2201/4233
USPC .............. 348/294, 311, 321, 323, 222.1, 241, 348/231.6; 341/155, 169, 126; 250/208.1
See application file for complete search history.

(56) References Cited

U.S. PATENT DOCUMENTS

| | | | | |
|---|---|---|---|---|
| 6,891,491 B2* | 5/2005 | Nakamura et al. | ............. | 341/155 |
| 7,671,313 B2* | 3/2010 | Watanabe | .................. | 250/208.1 |
| 8,284,285 B2* | 10/2012 | Takahashi | ..................... | 348/302 |
| 2008/0211946 A1* | 9/2008 | Uchida | .......................... | 348/294 |
| 2013/0228673 A1* | 9/2013 | Hashimoto et al. | ........ | 250/208.1 |

FOREIGN PATENT DOCUMENTS

| | | | |
|---|---|---|---|
| JP | 2004-274157 A | 9/2004 | |
| JP | 2006-287879 A | 10/2006 | |

* cited by examiner

*Primary Examiner* — Aung S Moe
(74) *Attorney, Agent, or Firm* — Westerman, Hattori, Daniels & Adrian, LLP

(57) ABSTRACT

An image processing device comprising: first A/D converters that receive output signals of respective columns of a plurality of pixels arranged in a matrix form, convert the output signals into first digital signals, and output the first digital signals; a second A/D converter that receives a correction signal, converts the correction signal into a second digital signal, and outputs the second digital signal; a first correction calculation unit that produces a first correction formula; a second correction calculation unit that produces a second correction formula based on the second digital signal; a determination unit that compares a coefficient of the second correction formula and a coefficient of a second correction formula produced before the second correction formula, and determines whether or not to produce the first correction formula based on the comparison result; and a signal output unit that outputs an update signal when it is determined to produce the first correction formula.

15 Claims, 4 Drawing Sheets

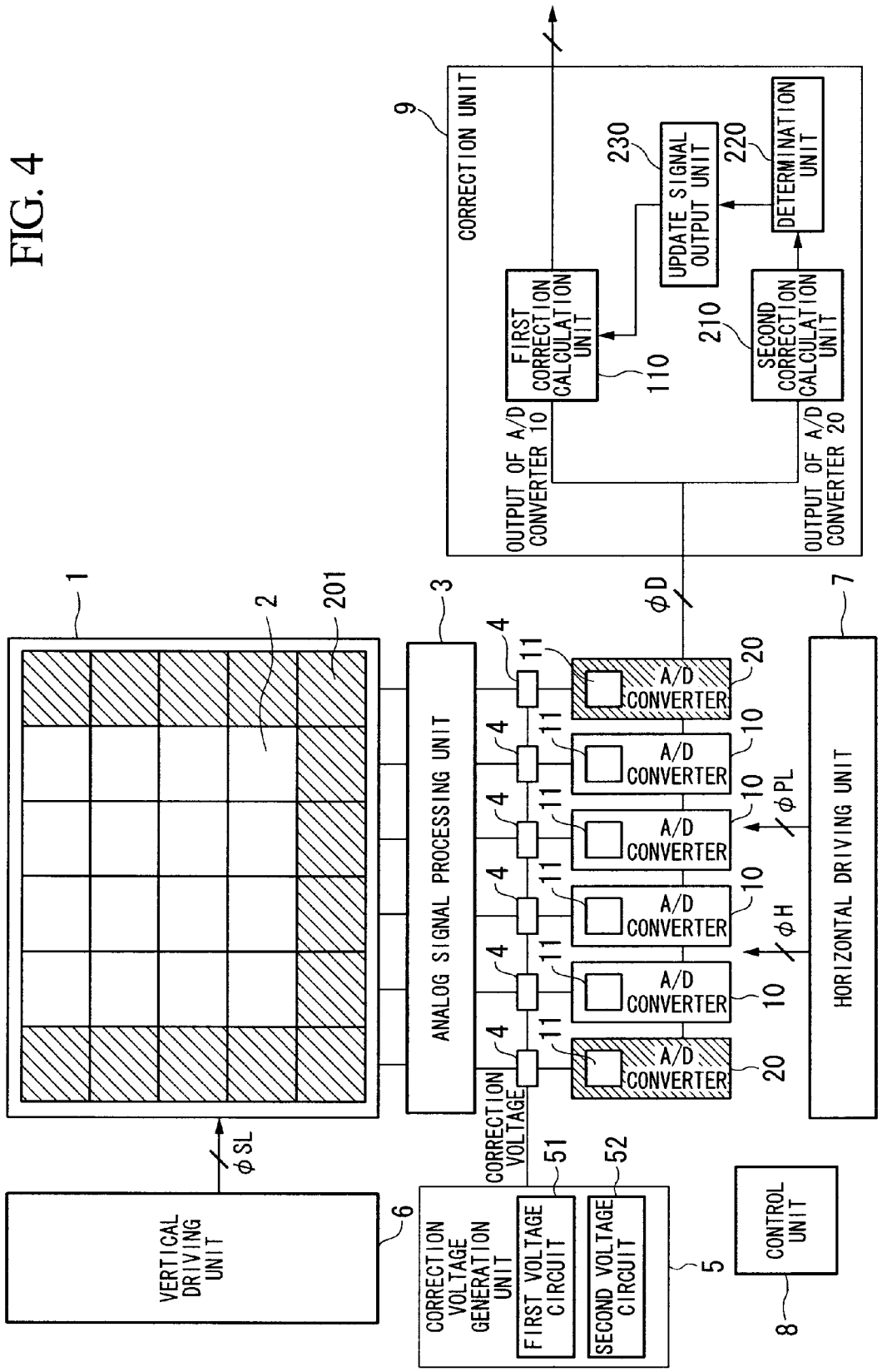

SOLID-STATE IMAGING DEVICE, METHOD OF DRIVING SOLID-STATE IMAGING DEVICE, AND IMAGE PROCESSING DEVICE

BACKGROUND OF THE INVENTION

1. Field of the Invention

The present invention relates to a solid-state imaging device, a method of driving a solid-state imaging device, and an image processing device.

Priority is claimed on Japanese Patent Application No. 2010-024408, filed Feb. 5, 2010, the content of which is incorporated herein by reference.

2. Description of the Related Art

All patents, patent applications, patent publications, scientific articles, and the like, which will hereinafter be cited or identified in the present application, will hereby be incorporated by reference in their entirety in order to describe more fully the state of the art to which the present invention pertains.

Recent imaging devices such as digital cameras, camcorders, and endoscopes include solid-state imaging devices such as charge coupled device (CCD) image sensors or complementary metal oxide semiconductor (CMOS) image sensors. Demands for reduction in size and power consumption of imaging devices are continuously increasing.

There is a solid-state imaging device including a plurality of time analog-to-digital converter type analog/digital (A/D) converters (TADs). A TAD outputs a frequency pulse according to a pixel signal, and a counter counts the pulse, thereby performing A/D conversion on the pixel signal. The pixel signal corresponds to voltage output from a pixel. An area in which pixels are arranged in a two-dimensional matrix is referred to as a pixel block. Japanese Patent Laid-Open No. 2006-287879 discloses a solid-state imaging device having a TAD in which the TAD is disposed in a pixel block to perform A/D conversion on a pixel signal with a high signal-to-noise (S/N) ratio.

A TAD has a nonlinear input/output (I/O) characteristic. Thus, an output value needs to be corrected to make the I/O characteristic linear.

Japanese Unexamined Patent Application, First Publication No. 2004-274157 discloses a method of correcting an output value of a TAD. Correlated double sampling (CDS) is performed on a pixel signal. It is determined whether the resultant voltage belongs to a high voltage region or a low voltage region constituting a voltage region. Using a correction formula corresponding to the corresponding region, an output value of the TAD is corrected.

SUMMARY

A solid-state imaging device may include: a plurality of pixels that are arranged in a matrix form and output output signals; a plurality of first A/D converters that receive the output signals of respective columns of the plurality of pixels, convert the output signals into first digital signals, and output the first digital signals; a second A/D converter that receives a correction signal, converts the correction signal into a second digital signal, and outputs the second digital signal; a first correction calculation unit that produces a first correction formula for correcting linearity of the first digital signals; a second correction calculation unit that produces a second correction formula for correcting linearity of the second digital signal based on the second digital signal; a determination unit that compares a coefficient of the second correction formula produced by the second correction calculation unit and a coefficient of a second correction formula produced before the second correction formula, and determines whether or not to produce the first correction formula based on the comparison result; and a signal output unit that outputs an update signal for causing the first correction calculation unit to produce the first correction formula to the first correction calculation unit when it is determined to produce the first correction formula.

The correction signal may be a constant voltage for reference.

The correction signal may be an output signal of the pixel masked to block incident light.

The first correction calculation unit may correct a coefficient of the first correction formula based on a rate of change of the coefficient of the second correction formula.

The plurality of first A/D converters may receive the correction signal, convert the correction signal into digital signals, and output the digital signals as third digital signals. The first correction calculation unit may produce the first correction formula based on the third digital signals.

A method of driving a solid-state imaging device may include: receiving output signals of respective columns of a plurality of pixels arranged in a matrix form, converting the output signals into first digital signals, and outputting the first digital signals; receiving a correction signal, converting the correction signal into a second digital signal, and outputting the second digital signal; producing a first correction formula for correcting linearity of the first digital signals; producing a second correction formula for correcting linearity of the second digital signal based on the second digital signal; determining whether or not to produce the first correction formula based on a result of comparison between a coefficient of the second correction formula and a coefficient of a second correction formula produced before the second correction formula; and outputting an update signal for causing a first correction calculation unit to produce the first correction formula to the first correction calculation unit, when it is determined to produce the first correction formula.

The correction signal may be a constant voltage for reference.

The correction signal may be an output signal of the pixel masked to block incident light.

A coefficient of the first correction formula may be corrected based on a rate of change of the coefficient of the second correction formula.

The method of driving a solid-state imaging device may further include: receiving the correction signal; converting the correction signal into digital signals; and outputting the digital signals as third digital signals. The first correction formula may be produced based on the third digital signals.

An image processing device may include: a plurality of first A/D converters, each of which receives output signals of respective columns of a plurality of pixels, the plurality of pixels being arranged in a matrix form, each of the plurality of first A/D converters converting the output signals into first digital signals, each of the plurality of first A/D converters outputting the first digital signals; a second A/D converter that receives a correction signal, converts the correction signal into a second digital signal, and outputs the second digital signal; a first correction calculation unit that produces a first correction formula for correcting linearity of the first digital signals; a second correction calculation unit that produces a second correction formula for correcting linearity of the second digital signal based on the second digital signal; a determination unit that compares a coefficient of the second correction formula produced by the second correction calculation unit and a coefficient of a second correction formula produced before the second correction formula, and determines whether or not to produce the first correction formula based on the comparison result; and a signal output unit that outputs an update signal for causing the first correction calculation unit to produce the first correction formula to the first correction calculation unit when it is determined to produce the first correction formula.

The correction signal may be a constant voltage for reference.

The correction signal may be an output signal of the pixel masked to block incident light.

The first correction calculation unit may correct a coefficient of the first correction formula based on a rate of change of the coefficient of the second correction formula.

The plurality of first A/D converters may receive the correction signal, convert the correction signal into digital signals, and output the digital signals as third digital signals. The first correction calculation unit may produce the first correction formula based on the third digital signals.

BRIEF DESCRIPTION OF THE DRAWINGS

The above features and advantages of the present invention will be more apparent from the following description of certain preferred embodiments taken in conjunction with the accompanying drawings, in which:

FIG. 4 a block diagram showing a schematic constitution of a solid-state imaging device according to a second preferred embodiment of the present invention.

DETAILED DESCRIPTION OF THE PREFERRED EMBODIMENTS

The present invention will be now described herein with reference to illustrative embodiments. Those skilled in the art will recognize that many alternative embodiments can be accomplished using the teaching of the present invention and that the present invention is not limited to the embodiments illustrated for explanatory purpose.

First Preferred Embodiment

Figure 1:
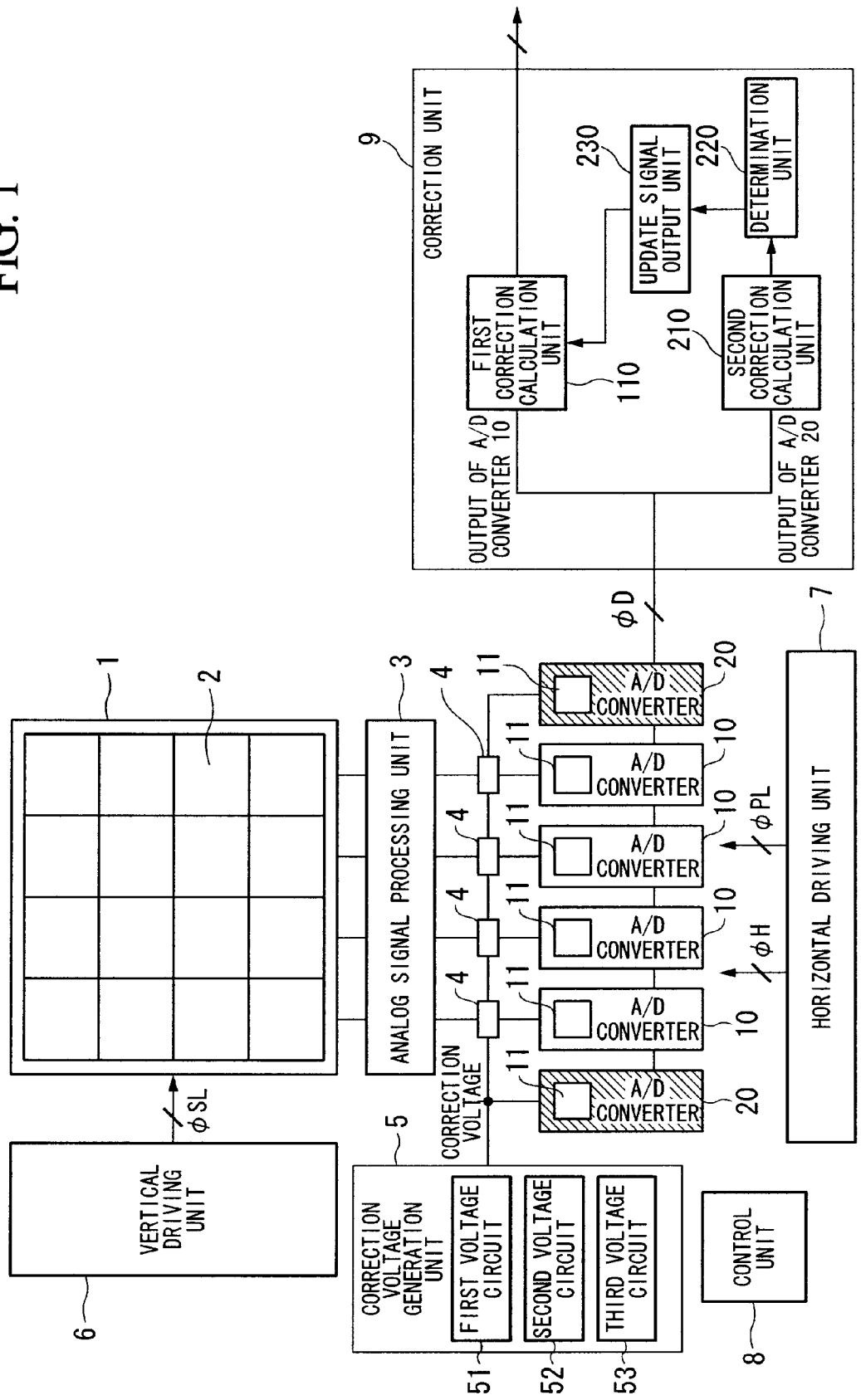
FIG. 1 is a block diagram showing a schematic constitution of a solid-state imaging device according to a first preferred embodiment of the present invention.

A first preferred embodiment of the present invention will be described below. FIG. 1 is a block diagram showing a schematic constitution of a solid-state imaging device according to this embodiment. The solid-state imaging device includes a pixel unit 1, an analog signal processing unit 3, switch units 4, a correction voltage generation unit 5, a vertical driving unit 6, a horizontal driving unit 7, a control unit 8, a correction unit 9, first analog/digital (A/D) converters 10, and second A/D converters 20. The pixel unit 1 includes a plurality of pixels 2 arranged in a matrix form. The first A/D converters 10 have pulse delay circuits 11. The second A/D converters 20 have the pulse delay circuits 11.

The pixels 2 output optical signals according to the amount of incident light. The analog signal processing unit 3 calculates a difference between a reset-time signal and an incident-light-dependent optical signal output from each of the pixels 2, thereby generating a pixel signal whose reset-time noise is suppressed. The analog signal processing unit 3 outputs the generated pixel signal as an input signal Vin. The switch units 4 switch signals input to the first A/D converters 10 and the second A/D converters 20. The correction voltage generation unit 5 has a first voltage circuit 51 generating a voltage Vref3, a second voltage circuit 52 generating a voltage Vref2, and a third voltage circuit 53 generating a voltage Vref1. The voltages Vref1, Vref2 and Vref3 become references for producing a correction formula. The correction voltage generation unit 5 outputs the voltages Vref1, Vref2 and Vref3 by turns. The voltage Vref1 is the lowest, the voltage Vref2 is the second lowest, and the voltage Vref3 is the highest (Vref1<Vref2<Vref3).

The vertical driving unit 6 selects the pixels 2 outputting signals from among the pixels 2 arranged in the matrix form according to rows. The horizontal driving unit 7 controls the first A/D converters 10 and the second A/D converters 20 to output output digital signals ΦD in sequence. The control unit 8 controls each unit that the solid-state imaging device has. The correction unit 9 corrects the output digital signals ΦD output by the first A/D converters 10 and the second A/D converters 20. The first A/D converters 10 and the second A/D converters 20 are time analog-to-digital converter type A/D converters (TADs). The first A/D converters 10 and the second A/D converters 20 receive analog signals, convert the analog signals into digital signals, and output the digital signals.

The correction unit 9 has a first correction calculation unit 110, a second correction calculation unit 210, a determination unit 220, and an update signal output unit 230. The first correction calculation unit 110 produces a first correction formula for correcting linearity of outputs of the first A/D converters 10. The second correction calculation unit 210 produces a second correction formula for correcting linearity of outputs of the second A/D converters 20. The determination unit 220 determines whether or not there is a change in the second correction formula. The update signal output unit 230 outputs an update signal for causing the first correction calculation unit 110 to produce the first correction formula.

Figure 2:
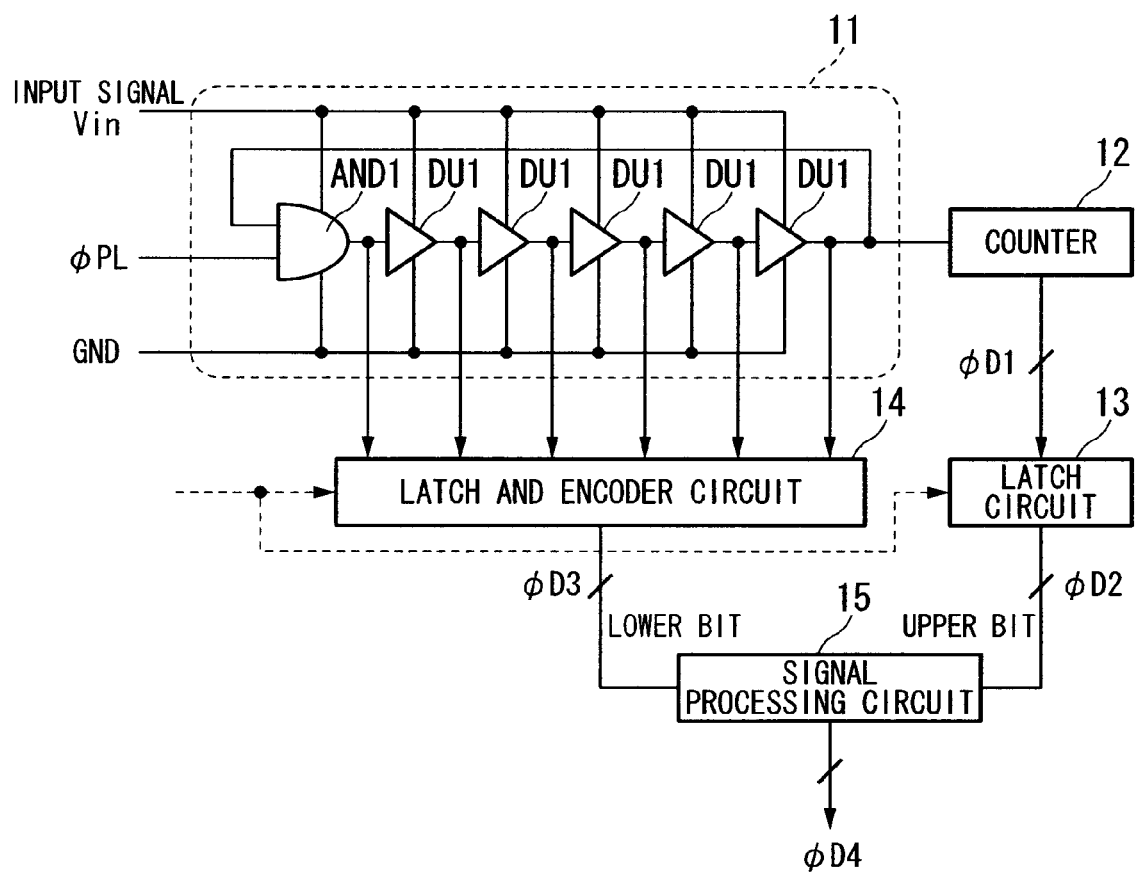
FIG. 2 is a block diagram showing a schematic constitution of an analog/digital (A/D) converter according to the first preferred embodiment of the present invention.

Next, a constitution of the first A/D converters 10 and the second A/D converters 20 will be described. The first A/D converters 10 have the same constitution as the second A/D converters 20. FIG. 2 is a block diagram showing a schematic constitution of the first A/D converters 10 and the second A/D converters 20 according to this embodiment. The first A/D converters 10 and the second A/D converters 20 include the pulse delay circuit 11 and a circuit for detecting the number of stages through which a pulse has passed. The circuit for detecting the number of stages through which a pulse has passed has a counter 12, a latch circuit 13, a latch and encoder circuit 14, and a signal processing circuit 15.

The pulse delay circuit 11 includes one delay element AND1 and a plurality of delay elements DU1 connected in a ring shape. The input signal Vin is supplied to each delay element. The input signal Vin is a pixel signal output by the analog signal processing unit 3 or a correction voltage output by the correction voltage generation unit 5. The delay element delays an input pulse ΦPL for a delay time according to a signal level of the input signal Vin using the input signal Vin as a power supply voltage. The pulse delay circuit 11 generates a pulse signal ΦCK having a frequency according to delay times of the delay elements.

The counter 12 counts the pulse signal ΦCK generated by the pulse delay circuit 11, that is, the number of rounds of the input pulse ΦPL. The counter 12 outputs the count result as a digital signal ΦD1. The latch circuit 13 latches the digital signal ΦD1 output by the counter 12 and outputs the latched digital signal as a digital signal ΦD2. The latch and encoder circuit 14 receives outputs of the delay element in the pulse delay circuit 11. The number of delay element stages through which the input pulse ΦPL has passed corresponds to position information about the pulse signal ΦCK. The latch and encoder circuit 14 detects the position information about the pulse signal ΦCK and outputs the detection result as a digital signal ΦD3.

The signal processing circuit 15 receives the digital signal ΦD2 from the latch circuit 13 and the digital signal ΦD3 from the latch and encoder circuit 14. The signal processing circuit 15 processes the digital signals ΦD2 and ΦD3, and generates a digital signal ΦD4 according to the signal level of the input signal Vin, that is, the pixel signal output by the analog signal processing unit 3. The digital signal ΦD4 is an output digital signal ΦD (Vin) A/D-converted by the first A/D converters 10 and the second A/D converters 20.

Next, a sequence in which the first correction calculation unit 110 produces a first correction formula according to this embodiment will be described. Digital signals ΦD output by the first A/D converters 10 are corrected using first correction formulae. Before the solid-state imaging device takes an image (e.g., immediately after a start), the first correction calculation unit 110 performs the following process to produce and store first correction formulae corresponding to the first A/D converters 10.

At first, the control unit 8 controls the switch units 4 so that a correction voltage output by the correction voltage generation unit 5 is input to the first A/D converters 10. Then, the correction voltage output by the correction voltage generation unit 5 is input to the first A/D converters 10.

Subsequently, the control unit 8 controls the correction voltage generation unit 5 to output the correction voltage Vref1. The first A/D converters 10 output output digital signals ΦD (Vref1) according to the input correction voltage Vref1 to the first correction calculation unit 110. Subsequently, the control unit 8 controls the correction voltage generation unit 5 to output the correction voltage Vref2. The first A/D converters 10 output output digital signals ΦD (Vref2) according to the input correction voltage Vref2 to the first correction calculation unit 110. Subsequently, the control unit 8 controls the correction voltage generation unit 5 to output the correction voltage Vref3. The first A/D converters 10 output output digital signals ΦD (Vref3) according to the input correction voltage Vref3 to the first correction calculation unit 110. In this way, the output digital signals ΦD (Vref1), ΦD (Vref2) and ΦD (Vref3) of the first A/D converters 10 are input to the first correction calculation unit 110.

Subsequently, the first correction calculation unit 110 produces first correction formulae of the first A/D converters 10 based on the output digital signals ΦD (Vref1), ΦD (Vref2) and ΦD (Vref3). Any correction formulae whereby outputs of the first A/D converters 10 can be corrected can be used as the first correction formulae of the first A/D converters 10 produced by the first correction calculation unit 110.

For example, a case in which Formula 1 is used as the first correction formulae of the first A/D converters 10 will be described. Based on the output digital signals ΦD (Vref1), ΦD (Vref2) and ΦD (Vref3), the first correction calculation unit 110 calculates a slope and intercept of Formula 1, which are correction coefficients, or MIN, MAX and C of Formula 1, thereby producing the first correction formula. In Formula 1, X denotes an output digital signal ΦD (Vin) input from the A/D converters 10. MIN denotes the output digital signal ΦD (Vref1), and MAX denotes the output digital signal ΦD (Vref3). C denotes the output digital signal ΦD (Vref2). A correction value H is a digital signal ΦD (H) obtained by correcting the output digital signal ΦD (Vin) output by the first A/D converters 10 based on the first correction formula.

$$\text{If } \text{MIN} \le X \le C, \qquad \text{Formula 1}$$
$$\text{then}$$
$$H = (X - \text{MIN}) \times \frac{(\text{MAX} + \text{MIN})/2 - \text{MIN}}{(C - \text{MIN})} + \text{MIN}.$$
$$\text{If } C < X \le \text{MAX},$$
$$\text{then}$$
$$H = (X - C) \times \frac{\text{MAX} - (\text{MAX} + \text{MIN})/2}{(\text{MAX} - C)} + (\text{MAX} + \text{MIN})/2.$$

Next, a sequence in which the second correction calculation unit 210 produces a second correction formula according to this embodiment will be described. Output digital signals ΦD output by the second A/D converters 20 are corrected using second correction formulae. Before the solid-state imaging device takes an image (e.g., immediately after a start), the second correction calculation unit 210 performs the following process to produce and store second correction formulae of the second A/D converters 20. When the solid-state imaging device outputs an image signal to the outside, the second correction calculation unit 210 performs the following process to produce the second correction formulae of the second A/D converters 20.

At first, the control unit 8 controls the switch units 4 so that a correction voltage output by the correction voltage generation unit 5 is input to the second A/D converters 20. Then, the correction voltage output by the correction voltage generation unit 5 is input to the second A/D converters 20.

Subsequently, the control unit 8 controls the correction voltage generation unit 5 to output the correction voltage Vref1. The second A/D converters 20 output output digital signals ΦD (Vref1) according to the input correction voltage Vref1 to the second correction calculation unit 210. Subsequently, the control unit 8 controls the correction voltage generation unit 5 to output the correction voltage Vref2. The second A/D converters 20 output output digital signals ΦD (Vref2) according to the input correction voltage Vref2 to the second correction calculation unit 210. Subsequently, the control unit 8 controls the correction voltage generation unit 5 to output the correction voltage Vref3. The second A/D converters 20 output output digital signals ΦD (Vref3) according to the input correction voltage Vref3 to the second correction calculation unit 210. In this way, the output digital signals ΦD (Vref1), ΦD (Vref2) and ΦD (Vref3) of the second A/D converters 20 are input to the second correction calculation unit 210.

Subsequently, the second correction calculation unit 210 produces second correction formulae based on the output digital signals ΦD (Vref1), ΦD (Vref2) and ΦD (Vref3) in the same way as the first correction calculation unit 110 produces first correction formulae.

Next, a sequence in which light is incident on the pixel unit 1 of the solid-state imaging device and signals generated by the pixels 2 are converted into digital signals according to this embodiment will be described. At first, the vertical driving unit 6 sets a pixel selection signal ΦSL to a "high" level. Then, the pixels 2 of a first row of the pixel unit 1 are selected, and signals of the pixels 2 of the selected first row are output to the analog signal processing unit 3. Each of the selected pixels 2 outputs two signals, that is, a reset-time signal output when a photoelectric conversion device in the pixel 2 is reset and an incident-light-dependent optical signal according to the amount of incident light. The analog signal processing unit 3 calculates a difference between the reset-time signal and the incident-light-dependent optical signal output by each of the pixels 2. In this way, a pixel signal whose reset-time noise is suppressed is generated. The generated pixel signal is output as the input signal Vin to the corresponding one of the first A/D converters 10 prepared for columns of the pixels 2. At this time, the control unit 8 controls the switch units 4 and the correction voltage generation unit 5 to input the correction voltage Vref1 generated by the correction voltage generation unit 5 to the second A/D converters 20.

Subsequently, the control unit 8 sets the input pulse $\Phi$PL output to the first A/D converters 10 and the second A/D converters 20 to a "high" level. Then, the pulse delay circuit 11 in each of the first A/D converters 10 and the second A/D converters 20 delays the input pulse $\Phi$PL for a delay according to a difference between a signal level of the input signal Vin input from the analog signal processing unit 3 or the correction voltage generator 5 or the correction voltage Vref1 and ground voltage GND. The pulse delay circuit 11 generates the pulse signal $\Phi$CK having a frequency according to delays of the delay elements. The counter 12 counts the pulse signal $\Phi$CK output by the pulse delay circuit 11.

After a predetermined time period, the latch and encoder circuit 14 detects position information about the pulse signal $\Phi$CK in the pulse delay circuit 11. At the same time, the latch circuit 13 latches the count result of the counter 12. After this, the control unit 8 sets the input pulse $\Phi$PL to a "low" level. Then, delay of the input pulse $\Phi$PL in the pulse delay circuit 11 is stopped, and generation of the pulse signal $\Phi$CK is finished.

Subsequently, the signal processing circuit 15 processes the digital signal $\Phi$D2 output by the latch circuit 13 and the digital signal $\Phi$D3 output by the latch and encoder circuit 14. Also, the signal processing circuit 15 outputs the digital signal $\Phi$D4 according to a signal level of the input signal Vin input from the analog signal processing unit 3 or the correction voltage generation unit 5, or the correction voltage Vref1 as the output digital signal $\Phi$D (Vin) or $\Phi$D (Vref1). In other words, the first A/D converters 10 output output digital signals $\Phi$D (Vin) according to pixel signals of the pixels 2, and the second A/D converters 20 output the output digital signals $\Phi$D (Vref1) according to the correction voltage Vref1 of the correction voltage generation unit 5.

Subsequently, the horizontal driving unit 7 sets readout control signals $\Phi$H to a "high" level in sequence. Then, the output digital signals $\Phi$D (Vin) output by the first A/D converters 10 are input to the first correction calculation unit 110 of the correction unit 9 in sequence. Also, the output digital signals $\Phi$D (Vref1) output by the second A/D converters 20 are input to the second correction calculation unit 210 of the correction unit 9 in sequence.

The first correction calculation unit 110 corrects the output digital signals $\Phi$D (Vin) according to a first correction formula. The first correction calculation unit 110 outputs the digital signals $\Phi$D (H) obtained after correction to the outside as image signals of the pixels 2 in the first row of the solid-state imaging device. The second correction calculation unit 210 temporarily stores the output digital signals $\Phi$D (Vref1) according to the correction voltage Vref1.

Subsequently, the vertical driving unit 6 sets the pixel selection signal $\Phi$SL to a "low" level. Then, the readout of the pixels 2 in the first row is finished.

The solid-state imaging device repeatedly performs the above-described sequence. The solid-state imaging device converts electric potentials generated by the pixels 2 of a second row to the last row into digital signals and outputs the digital signals to the outside as image signals of the pixels 2 of the second row to the last row. In this way, the solid-state imaging device can output image signals of all the pixels 2 to the outside.

As mentioned above, the electric potentials generated by the pixels 2 of the second row are converted into digital signals and output to the outside as image signals of the pixels 2 of the second row. At this time, the control unit 8 controls the switch units 4 and the correction voltage generation unit 5 to input the correction voltage Vref2 generated by the correction voltage generation unit 5 to the second A/D converters 20. The second A/D converters 20 output the output digital signals $\Phi$D (Vref2) according to the correction voltage Vref2 of the correction voltage generation unit 5. The second correction calculation unit 210 temporarily stores the output digital signals $\Phi$D (Vref2) according to the correction voltage Vref2.

As mentioned above, the electric potentials generated by the pixels 2 of the third row are converted into digital signals and output to the outside as image signals of the pixels 2 of the third row. At this time, the control unit 8 controls the switch units 4 and the correction voltage generation unit 5 to input the correction voltage Vref3 generated by the correction voltage generation unit 5 to the second A/D converters 20. The second A/D converters 20 output the output digital signals $\Phi$D (Vref3) according to the correction voltage Vref3 of the correction voltage generation unit 5. The second correction calculation unit 210 temporarily stores the output digital signals $\Phi$D (Vref3) according to the correction voltage Vref3.

As mentioned above, the electric potentials generated by the pixels 2 of the fourth row to the last row are converted into digital signals and output to the outside as image signals of the pixels 2 of the fourth row to the last row. At this time, the correction voltage generation unit 5 and the second A/D converters 20 do not perform the same process as mentioned above. At this time, the second correction calculation unit 210 produces second correction formulae of the second A/D converters 20 based on the output digital signals $\Phi$D (Vref1), $\Phi$D (Vref2) and $\Phi$D (Vref3). Then, the second correction calculation unit 210 can newly produce second correction formulae of the second A/D converters 20 every time the solid-state imaging device takes an image. After producing the second correction formulae, the second correction calculation unit 210 removes the temporarily stored output digital signals $\Phi$D (Vref1), $\Phi$D (Vref2) and $\Phi$D (Vref3).

Figure 3:
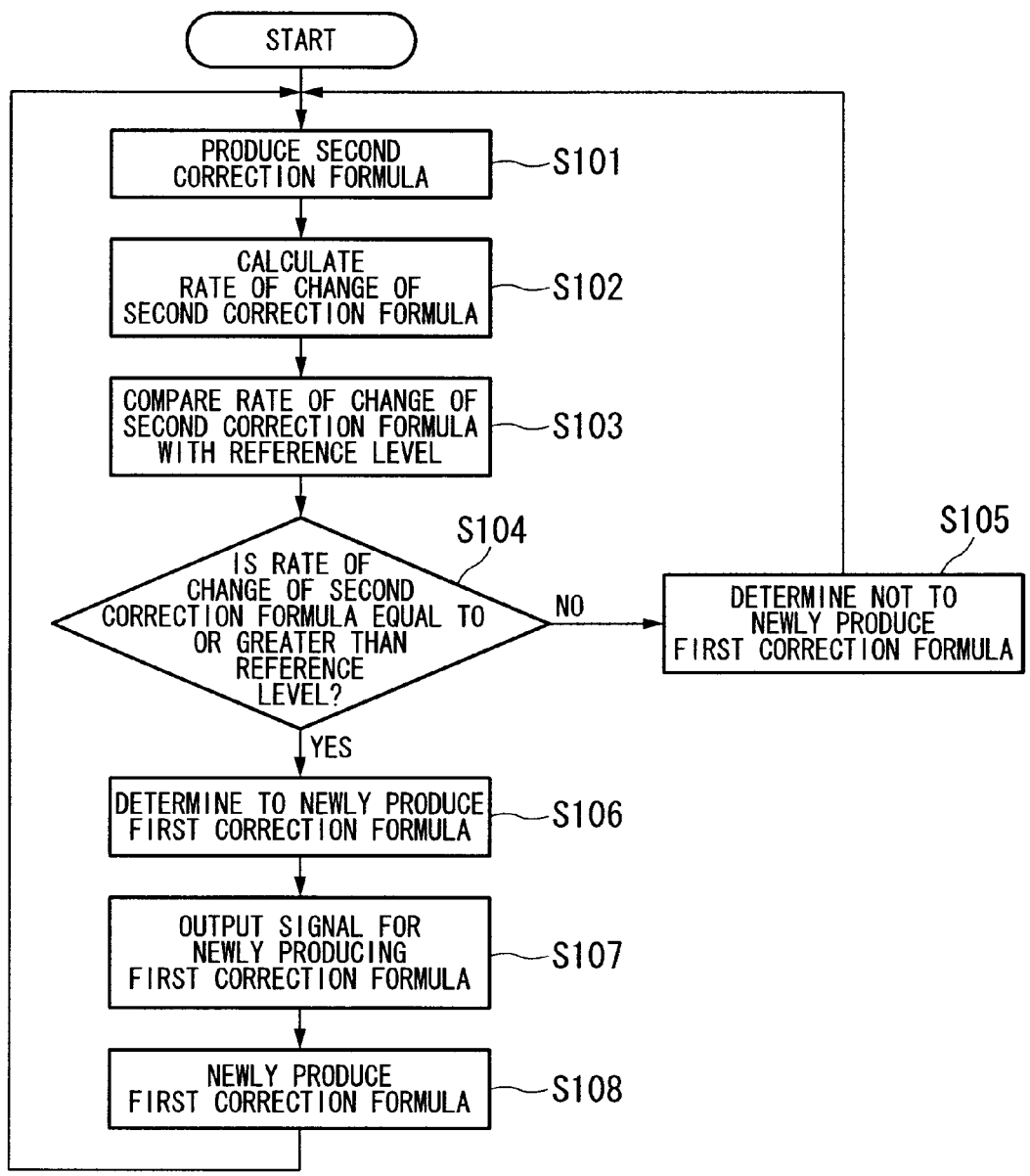
FIG. 3 is a flowchart illustrating a correction sequence of a first correction formula according to the first preferred embodiment of the present invention.

Next, a sequence of newly producing a first correction formula will be described. FIG. 3 is a flowchart illustrating a sequence of newly producing a first correction formula according to this embodiment.
(Step S101)

The solid-state imaging device takes an image. At this time, the second correction calculation unit 210 produces correction formulae of the second A/D converters 20. Then, the process proceeds to step S102.
(Step S102)

The determination unit 220 calculates a rate of change between a correction coefficient of a second correction formula of each of the second A/D converters 20 stored by the second correction calculation unit 210 and a correction coefficient of a second correction formula of the second A/D converters 20 produced in step S101. Then, the process proceeds to step S103.
(Step S103)

The determination unit 220 compares the rate of change calculated in step S102 and a predetermined reference value. Then, the process proceeds to step S104. However, when the solid-state imaging device has a plurality of second A/D converters 20, a rate of change of a correction coefficient of a second correction formula of any one of the second A/D converters 20 may be compared with the predetermined reference value. Alternatively, the average rate of change of correction coefficients of second correction formulae of the plurality of second A/D converters 20 may be compared with the predetermined reference value.

(Step S104)

The determination unit 220 determines whether or not the rate of change calculated in step S102 is the predetermined reference value or more based on the comparison result of step S103. When it is determined that the rate of change calculated in step S102 is the predetermined reference value or more, the process proceeds to step S106. On the other hand, when it is determined that the rate of change calculated in step S102 is less than the predetermined reference value, the process proceeds to step S105.

(Step S105)

The determination unit 220 determines not to newly produce a first correction formula. The second correction calculation unit 210 discards the second correction formulae produced in step S101. Then, the process proceeds back to step S101.

(Step S106)

The determination unit 220 determines to newly produce a first correction formula. Then, the process proceeds to step S107.

(Step S107)

Since the determination unit 220 has determined to newly produce a first correction formula, the update signal output unit 230 outputs a signal for newly producing a first correction formula to the first correction calculation unit 110. Then, the process proceeds to step S108.

(Step S108)

Since the signal for newly producing a first correction formula has been input from the update signal output unit 230, the first correction calculation unit 110 newly produces a first correction formula. Thereafter, the first correction calculation unit 110 corrects output digital signals ΦD (Vin) using the newly produced first correction formula. The second correction calculation unit 210 discards a stored second correction formula and stores the second correction formulae produced in step S101. Then, the process proceeds back to step S101. Here, any method can be used for the first correction calculation unit 110 to newly produce a first correction formula.

For example, in step S102, the first correction calculation unit 110 may newly produce a first correction formula using the rate of change of the correction coefficient of the second correction formula calculated by the determination unit 220. When temperature of the solid-state imaging device varies and thus the correction coefficient of the first correction formula and the correction coefficient of the second correction formula vary, the correction coefficient of the first correction formula can be considered to have the same rate of change as the second correction formula. The first correction calculation unit 110 corrects the correction coefficient of the first correction formula so that the rate of change of the correction coefficient of the first correction formula becomes the same as that of the correction coefficient of the second correction formula. For example, when the correction coefficient of the second correction formula becomes 1.2 times the original correction coefficient, the first correction calculation unit 110 multiplies the correction coefficient of the first correction formula by 1.2. In this way, the first correction calculation unit 110 can newly produce a first correction formula using the rate of change of the correction coefficient of the second correction formula.

When the solid-state imaging device has the plurality of second A/D converters 20, the determination unit 220 may calculate the average rate of change of correction coefficients of second correction formulae of the plurality of second A/D converters 20. The first correction calculation unit 110 may correct the correction coefficient of the first correction formula using the average rate of change. In this way, the first correction calculation unit 110 can newly produce a first correction formula using the average rate of change of the correction coefficients of the second correction formulae.

When the solid-state imaging device has two second A/D converters 20 and, as shown in FIG. 1, the two second A/D converters 20 are disposed to be spaced apart from each other with the first A/D converters 10 interposed between them, an average rate of change of correction coefficients of second correction formulae of the two second A/D converters 20 may not be simply used, but distance from the two second A/D converters 20 may be taken into consideration to produce a first correction formula. To be specific, the determination unit 220 calculates a rate of change of a correction coefficient according to the distance from the two second A/D converters 20.

The first correction calculation unit 110 corrects the correction coefficient of the first correction formula using the rate of change of a correction coefficient according to the distance from the two second A/D converters 20. In this way, the first correction calculation unit 110 can newly produce a first correction formula using the rate of change of a correction coefficient according to the distance from the two second A/D converters 20.

For example, a rate of change of a correction coefficient of a second correction formula of the left second A/D converter 20 is $\Delta AL20$, and a rate of change of a correction coefficient of a second correction formula of the right second A/D converter 20 is $\Delta AL20$. Between the left second A/D converter 20 and the right second A/D converter 20, n first A/D converters 10 are installed at regular intervals. Correction coefficients of first correction formulae of the first A/D converters 10 are $A10\_1, A10\_2, A10\_3, \ldots,$ and $A10\_n$ in order from left to right.

In consideration of the distance from the two second A/D converters 20, rates of change of the correction coefficients of the first correction formulae of the first A/D converters 10 become $\Delta AL20$, $\{\Delta AL20 \times (n-1) + \Delta AR20 \times 1\}/n$, $\{\Delta AL20 \times (n-2) + \Delta AR20 \times 2\}/n, \ldots,$ and $\Delta AR20$ in order from left to right.

Thus, a correction coefficient of a corrected first correction formula of the leftmost first A/D converter 10 becomes $A10\_1 \times \Delta AL20$. A correction coefficient of a corrected first correction formula of the first A/D converter 10 that is the second from the left becomes $A10\_2 \times \{\Delta AL20 \times (n-1) + \Delta AR20 \times 1\}/n$. A correction coefficient of a corrected first correction formula of the first A/D converter 10 that is the third from the left becomes $A10\_3 \times \{\Delta AL20 \times (n-2) + \Delta AR20 \times 2\}/n$. Also, a correction coefficient of a corrected first correction formula of the rightmost first A/D converter 10 that is the n-th from the left becomes $A10\_n \times \Delta AR20$.

In this way, the correction coefficient of the first correction formula is corrected using the rate of change of the correction coefficient according to the distance from the two second A/D converters 20, so that even if there is a temperature difference between the left second A/D converter 20 and the right second A/D converter 20, a first correction formula can be newly produced according to the temperature difference.

A first correction formula may be produced in the same way as a first correction formula produced before the solid-state imaging device takes an image. This method has greater throughput than a method of correcting a correction coefficient of a first correction formula using a rate of change of a correction coefficient of a second correction formula. Since a correction coefficient of a previously produced first correction formula is not corrected but the first correction calculation unit 110 produces a first correction formula using a reference voltage, accuracy of the first correction formula improves.

As described above, in this embodiment, first correction formulae of the plurality of first A/D converters 10 are not repeatedly produced, but second correction formulae of the second A/D converters 20 having a smaller number than the first A/D converters 10 are repeatedly produced. Also, when correction coefficients of the second correction formulae vary at a predetermined rate of change or more, first correction formulae of the first A/D converters 10 are newly produced. In this way, it is possible to reduce the number of correction formulae repeatedly produced in the solid-state imaging device. Thus, the production throughput of the first correction formulae of the first A/D converters 10 can be reduced.

In this embodiment, the first correction calculation unit 110 can also produce first correction formulae of the first A/D converters 10 based on correction coefficients of second correction formulae of the second A/D converters 20. In this case, correction coefficients of previously produced first correction formulae are corrected to produce the first correction formulae. Thus, this method has lower throughput than a method of producing first correction formulae using a reference voltage. In other words, correction throughput of the first correction formulae can be reduced.

Second Preferred Embodiment

A second preferred embodiment of the present invention will be described below with reference to a drawing. A solid-state imaging device of this embodiment is different from that of the first preferred embodiment in that a pixel unit 1 has optical black (OB) pixels, and a correction voltage generation unit 5 has a first voltage circuit 51 generating a voltage Vref3 and a second voltage circuit 52 generating a voltage Vref2.

FIG. 4 is a block diagram showing a schematic constitution of the solid-state imaging device according to this embodiment. In an example shown in the drawing, the solid-state imaging device includes the pixel unit 1, an analog signal processing unit 3, switch units 4, the correction voltage generation unit 5, a vertical driving unit 6, a horizontal driving unit 7, a control unit 8, a correction unit 9, first A/D converters 10, and second A/D converters 20. The pixel unit 1 includes a plurality of pixels 2 and light-shielded OB pixels 201 arranged in a matrix form.

The correction unit 9 has a first correction calculation unit 110, a second correction calculation unit 210, a determination unit 220, and an update signal output unit 230. The first correction calculation unit 110 produces a first correction formula for correcting linearity of the first A/D converters 10. The second correction calculation unit 210 produces a second correction formula for correcting linearity of the second A/D converters 20. The determination unit 220 determines whether or not there is a change in the second correction formula. The update signal output unit 230 outputs an update signal to the first correction calculation unit 110. The units of the solid-state imaging device are the same as those of the solid-state imaging device of the first preferred embodiment except for the pixel unit 1. Constitutions of the first A/D converters 10 and the second A/D converters 20 are the same as those of the first preferred embodiment, that is, the same as shown in FIG. 2. The OB pixels 201 are masked to block incident light.

Next, a sequence in which the first correction calculation unit 110 produces a first correction formula according to this embodiment will be described. Digital signals ΦD output by the first A/D converters 10 are corrected using a first correction formula. Before the solid-state imaging device takes an image (e.g., immediately after a start), the first correction calculation unit 110 performs the following process to produce and store first correction formulae corresponding to the first A/D converters 10.

At first, the control unit 8 controls the switch units 4 so that an input signal Vin output by the analog signal processing unit 3 is input to each of the first A/D converters 10. Subsequently, the control unit 8 controls the vertical driving unit 6 to input signals of the OB pixels 201 in a fifth row of the pixel unit 1 to the analog signal processing unit 3. The analog signal processing unit 3 generates pixel signals whose noise has been suppressed. The analog signal processing unit 3 outputs the generated pixel signals as input signals Vin(ob) to the first A/D converters 10 prepared according to columns of the pixels and the OB pixels 201. The first A/D converters 10 output output digital signals ΦD (Vin(ob)) according to the input signals Vin(ob) of the OB pixels 201 to the first correction calculation unit 110.

Subsequently, the control unit 8 controls the switch units 4 so that a correction voltage output by the correction voltage generation unit 5 is input to the first A/D converters 10. Thus, a correction voltage output by the correction voltage generation unit 5 is input to the first A/D converters 10. Subsequently, the control unit 8 controls the correction voltage generation unit 5 to output the correction voltage Vref2. The first A/D converters 10 output output digital signals ΦD (Vref2) according to the input correction voltage Vref2 to the first correction calculation unit 110. Subsequently, the control unit 8 controls the correction voltage generation unit 5 to output the correction voltage Vref3. The first A/D converters 10 output output digital signals ΦD (Vref3) according to the input correction voltage Vref3 to the first correction calculation unit 110. In this way, the output digital signals ΦD (Vin(ob)), ΦD (Vref2) and ΦD (Vref3) of the first A/D converters 10 are input to the first correction calculation unit 110. Here, the input signals Vin(ob) have the lowest voltage, the correction voltage Vref2 is the second lowest, and the correction voltage Vref3 is the highest (Vin(ob)<Vref2<Vref3).

Subsequently, the first correction calculation unit 110 produces correction formulae of the first A/D converters 10 based on the output digital signals ΦD (Vin(ob)), ΦD (Vref2) and ΦD (Vref3). Any correction formulae whereby outputs of the first A/D converters 10 can be corrected can be used as the correction formulae of the first A/D converters 10 produced by the first correction calculation unit 110. For example, the correction formulae are produced in the same way as described in the first preferred embodiment.

Next, a sequence in which the second correction calculation unit 210 produces a second correction formula according to this embodiment will be described. Output digital signals ΦD output by the second A/D converters 20 are corrected using second correction formulae. Before the solid-state imaging device takes an image (e.g., immediately after a start), the second correction calculation unit 210 performs the following process to produce and store second correction formulae of the second A/D converters 20. When the solid-state imaging device outputs an image signal to the outside, the second correction calculation unit 210 also performs the following process to produce second correction formulae of the second A/D converters 20.

At first, the control unit 8 controls the switch units 4 so that the input signal Vin output by the analog signal processing unit 3 is input to the first A/D converters 10. Subsequently, the control unit 8 controls the vertical driving unit 6 to input a signal of one OB pixel 201 per row among OB pixels 201 disposed in a first column and a fifth row of the pixel unit 1 to the analog signal processing unit 3. The analog signal processing unit 3 generates pixel signals whose noise has been suppressed. The generated pixel signals are output to the second A/D converters 20 as the input signals Vin(ob). The second A/D converters 20 output output digital signals $\Phi D$ (Vin(ob)) according to the input signals Vin(ob) of the OB pixels 201 to the second correction calculation unit 210.

Subsequently, the control unit 8 controls the switch units 4 so that a correction voltage output by the correction voltage generation unit 5 is input to the second A/D converters 20. Thus, a correction voltage output by the correction voltage generation unit 5 is input to the second A/D converters 20. Subsequently, the control unit 8 controls the correction voltage generation unit 5 to output the correction voltage Vref2. The second A/D converters 20 output output digital signals $\Phi D$ (Vref2) according to the input correction voltage Vref2 to the second correction calculation unit 210. Subsequently, the control unit 8 controls the correction voltage generation unit 5 to output the correction voltage Vref3. The second A/D converters 20 output output digital signals $\Phi D$ (Vref3) according to the input correction voltage Vref3 to the second correction calculation unit 210. In this way, the output digital signals $\Phi D$ (Vin(ob)), $\Phi D$ (Vref2) and $\Phi D$ (Vref3) of the second A/D converters 20 are input to the second correction calculation unit 210.

Subsequently, the second correction calculation unit 210 produces second correction formulae in the same way as the first correction calculation unit 110 based on the output digital signals $\Phi D$ (Vin(ob)), $\Phi D$ (Vref2) and $\Phi D$ (Vref3).

As described above, in this embodiment, the first A/D converters 10 and the second A/D converters 20 output the output digital signals $\Phi D$ (Vin(ob)) according to the input signals Vin(ob) resulting from pixel signals of the OB pixels 201, the output digital signals $\Phi D$ (Vref2) according to the correction voltage Vref2 output by the correction voltage generation unit 5, and the output digital signals $\Phi D$ (Vref3) according to the correction voltage Vref3 output by the correction voltage generation unit 5. The first correction calculation unit 110 produces first correction formulae based on the output digital signals $\Phi D$ (Vin(ob)), $\Phi D$ (Vref2) and $\Phi D$ (Vref3) output by the first A/D converters 10. The second correction calculation unit 210 produces second correction formulae based on the output digital signals $\Phi D$ (Vin(ob)), $\Phi D$ (Vref2) and $\Phi D$ (Vref3) output by the second A/D converters 20.

In other words, unlike the first preferred embodiment, signals output by the OB pixels 201 are used instead of the correction voltage Vref1 to produce first correction formulae and second correction formulae in this embodiment. Thus, the correction voltage generation unit 5 only has the first voltage circuit 51 generating the voltage Vref3 and the second voltage circuit 52 generating the voltage Vref2, and the circuit size can be reduced.

As used herein, the following directional terms "forward, rearward, above, downward, right, left, vertical, horizontal, below, and transverse" as well as any other similar directional terms refer to those directions of an apparatus equipped with the present invention. Accordingly, these terms, as utilized to describe the present invention should be interpreted relative to an apparatus equipped with the present invention.

The term "configured" is used to describe a component, section or part of a device includes hardware and/or software that is constructed and/or programmed to carry out the desired function.

Moreover, terms that are expressed as "means-plus function" in the claims should include any structure that can be utilized to carry out the function of that part of the present invention.

The terms of degree such as "substantially," "about," "nearly", and "approximately" as used herein mean a reasonable amount of deviation of the modified term such that the end result is not significantly changed. For example, these terms can be construed as including a deviation of at least ±5 percents of the modified term if this deviation would not negate the meaning of the word it modifies.

The term "unit" is used to describe a component, section or part of a hardware and/or software that is constructed and/or programmed to carry out the desired function. Typical examples of the hardware may include, but are not limited to, a device and a circuit.

While preferred embodiments of the present invention have been described and illustrated above, it should be understood that these are examples of the present invention and are not to be considered as limiting. Additions, omissions, substitutions, and other modifications can be made without departing from the scope of the present invention. Accordingly, the invention is not to be considered as being limited by the foregoing description, and is only limited by the scope of the claims.

What is claimed is:

1. A solid-state imaging device, comprising:
   a plurality of pixels that are arranged in a matrix form and output output signals;
   a plurality of first A/D converters that receive the output signals of respective columns of the plurality of pixels, convert the output signals into first digital signals, and output the first digital signals;
   a second A/D converter that receives a correction signal, converts the correction signal into a second digital signal, and outputs the second digital signal;
   a first correction calculation unit that produces a first correction formula for correcting linearity of the first digital signals;
   a second correction calculation unit that produces a second correction formula for correcting linearity of the second digital signal based on the second digital signal;
   a determination unit that compares a coefficient of the second correction formula produced by the second correction calculation unit and a coefficient of a second correction formula produced before the second correction formula, and determines whether or not to produce the first correction formula based on the comparison result; and
   a signal output unit that outputs an update signal for causing the first correction calculation unit to produce the first correction formula to the first correction calculation unit when it is determined to produce the first correction formula.

2. The solid-state imaging device according to claim 1, wherein the correction signal is a constant voltage for reference.

3. The solid-state imaging device according to claim 1, wherein the correction signal is an output signal of the pixel masked to block incident light.

4. The solid-state imaging device according to claim 1, wherein the first correction calculation unit corrects a coefficient of the first correction formula based on a rate of change of the coefficient of the second correction formula.

5. The solid-state imaging device according to claim 1, wherein
the plurality of first A/D converters receive the correction signal, convert the correction signal into digital signals, and output the digital signals as third digital signals, and
the first correction calculation unit produces the first correction formula based on the third digital signals.

6. A method of driving a solid-state imaging device, comprising:
receiving output signals of respective columns of a plurality of pixels arranged in a matrix form, converting the output signals into first digital signals, and outputting the first digital signals;
receiving a correction signal, converting the correction signal into a second digital signal, and outputting the second digital signal;
producing a first correction formula for correcting linearity of the first digital signals;
producing a second correction formula for correcting linearity of the second digital signal based on the second digital signal;
determining whether or not to produce the first correction formula based on a result of comparison between a coefficient of the second correction formula and a coefficient of a second correction formula produced before the second correction formula; and
outputting an update signal for causing a first correction calculation unit to produce the first correction formula to the first correction calculation unit, when it is determined to produce the first correction formula.

7. The method of driving a solid-state imaging device according to claim 6, wherein the correction signal is a constant voltage for reference.

8. The method of driving a solid-state imaging device according to claim 6, wherein the correction signal is an output signal of the pixel masked to block incident light.

9. The method of driving a solid-state imaging device according to claim 6, wherein a coefficient of the first correction formula is corrected based on a rate of change of the coefficient of the second correction formula.

10. The method of driving a solid-state imaging device according to claim 6, further comprising:
receiving the correction signal; converting the correction signal into digital signals; and outputting the digital signals as third digital signals; and wherein
the first correction formula is produced based on the third digital signals.

11. An image processing device comprising:
a plurality of first A/D converters, each of which receives output signals of respective columns of a plurality of pixels, the plurality of pixels being arranged in a matrix form, each of the plurality of first A/D converters converting the output signals into first digital signals, each of the plurality of first A/D converters outputting the first digital signals;
a second A/D converter that receives a correction signal, converts the correction signal into a second digital signal, and outputs the second digital signal;
a first correction calculation unit that produces a first correction formula for correcting linearity of the first digital signals;
a second correction calculation unit that produces a second correction formula for correcting linearity of the second digital signal based on the second digital signal;
a determination unit that compares a coefficient of the second correction formula produced by the second correction calculation unit and a coefficient of a second correction formula produced before the second correction formula, and determines whether or not to produce the first correction formula based on the comparison result; and
a signal output unit that outputs an update signal for causing the first correction calculation unit to produce the first correction formula to the first correction calculation unit when it is determined to produce the first correction formula.

12. The image processing device according to claim 11, wherein the correction signal is a constant voltage for reference.

13. The image processing device according to claim 11, wherein the correction signal is an output signal of the pixel masked to block incident light.

14. The image processing device according to claim 11, wherein the first correction calculation unit corrects a coefficient of the first correction formula based on a rate of change of the coefficient of the second correction formula.

15. The image processing device according to claim 11, wherein
the plurality of first A/D converters receive the correction signal, convert the correction signal into digital signals, and output the digital signals as third digital signals, and
the first correction calculation unit produces the first correction formula based on the third digital signals.

* * * * *